United States Patent [19]

Tanaka et al.

[11] Patent Number: 4,825,271
[45] Date of Patent: Apr. 25, 1989

[54] NONVOLATILE SEMICONDUCTOR MEMORY

[75] Inventors: Sumio Tanaka, Tokyo; Masaki Sato, Kawasaki; Shinji Saito, Yokohama; Shigeru Atsumi, Tokyo; Nobuaki Ohtsuka, Yokohama, all of Japan

[73] Assignee: Kabushiki Kaisha Toshiba, Kawasaki, Japan

[21] Appl. No.: 50,316

[22] Filed: May 15, 1987

[30] Foreign Application Priority Data

May 20, 1986 [JP] Japan .............................. 61-115582
Jul. 17, 1986 [JP] Japan .............................. 62-168537

[51] Int. Cl.$^4$ .................... H01L 29/78; H01L 29/34; H01L 27/20
[52] U.S. Cl. .................................... 357/23.5; 357/45; 357/54; 357/59; 365/185
[58] Field of Search ................... 357/23.5, 45, 54, 59; 365/285

[56] References Cited

U.S. PATENT DOCUMENTS

| | | | |
|---|---|---|---|
| 4,378,628 | 4/1983 | Levinstein et al. | 29/571 |
| 4,380,057 | 4/1983 | Kotecha et al. | 357/23.5 |
| 4,528,744 | 7/1985 | Shibata | 29/271 |
| 4,581,622 | 4/1986 | Takasaki et al. | 357/54 |
| 4,608,385 | 8/1986 | Keshtboyd | 357/23.5 |
| 4,635,342 | 1/1987 | Lien et al. | 357/23.5 |

OTHER PUBLICATIONS

S. P. Murarka et al., "Refractory Silicides of Titanium and Tantalum for Low-Resistivity Gates and Interconnects", *IEEE Transactions on Electron Devices*, vol. ED-27, No. 8, pp. 1409-1417, Aug. 1980.

F. Mohammadi, "Silicides for Interconnection Technology", *Solid State Technology*, pp. 65-72, 1981.

*Primary Examiner*—J. Carroll
*Attorney, Agent, or Firm*—Finnegan, Henderson, Farabow, Garrett & Dunner

[57] ABSTRACT

Disclosed is a nonvolatile semiconductor memory having a high access speed and high reliability. The memory includes a source diffusion region extending in one direction, a pair of first word lines arranged in parallel with the source diffusion region, such that the source diffusion region is interposed therebetween, drain diffusion regions disposed to face the source diffusion region, with the first word lines interposed therebetween, bit lines electrically connected to the drain diffusion regions and arranged to cross the first word lines, a channel region formed below each of the first word lines and positioned between the source diffusion region and the drain diffusion region, a floating gate electrode formed in an electrically floating manner above the channel region and below one of the pair of first word lines, and a second word line formed above the source region and positioned between and electrically connected to the pair of first word lines.

16 Claims, 6 Drawing Sheets

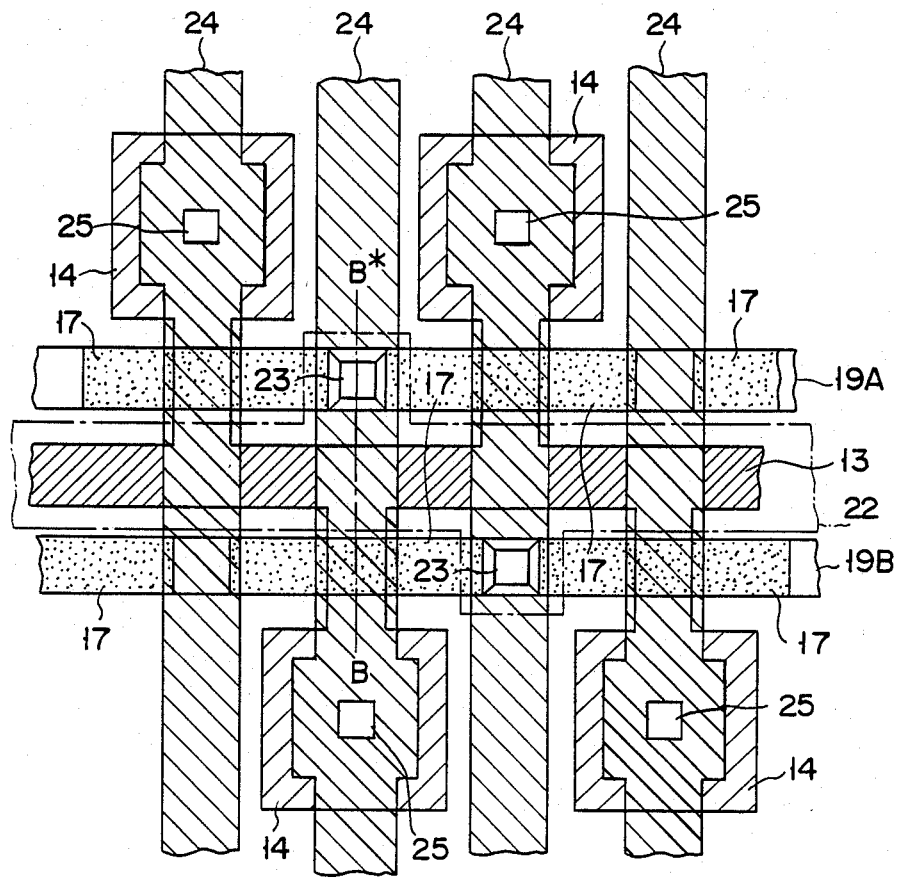
F I G. 2A
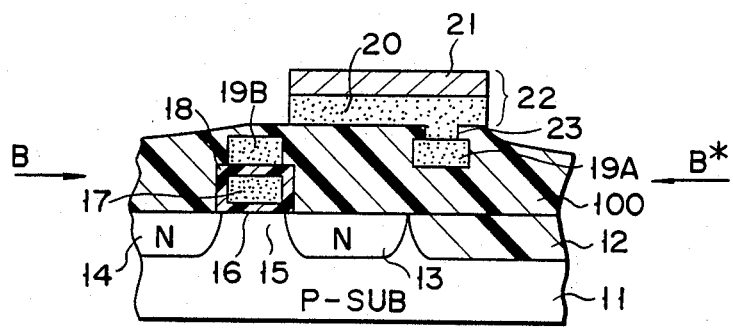
F I G. 2B

NONVOLATILE SEMICONDUCTOR MEMORY

BACKGROUND OF THE INVENTION

The present invention relates to a nonvolatile semiconductor memory capable of data writing and of retaining substantially permanently the data once written.

A nonvolatile semiconductor memory, particularly an EPROM (Erasable Programmable Read Only Memory) having a floating gate, is simple as regards the structure of its memory cells and thus is suitable for large-scale integration. At present, EPROMs of large capacities such as 256 Kbit, 512 Kbit, and 1 Mbit have been developed and put to practical use. In accordance with progress in computer systems using such EPROMs, the EPROM is required to operate at a high speed, thus resulting in serious demand for EPROMs of high reliability.

Attempts to improve the operating speed of EPROMs are reported by S. Moietal. in, for example, "1984 Symposium on VLSI Technology, Digest of Technical Papers", pages 40 and 41. It is reported that a titanium silicide layer, is formed on the surface of a polysilicon layer, in an attempt to decrease the resistance of the word line. It is also reported that the word line is formed of a polysilicon layer and a molybdenum silicide layer laminated thereon, i.e., a so-called "polycide structure", again in an attempt to decrease the resistance of the word line.

In the memory cells of these basic EPROMs, however, the electrons stored in the floating gate, which is electrically insulated from other members, should be retained over a long period of time without being released during operation of the EPROMs.

FIGS. 1A and 1B collectively show the memory cell array portion of an EPROM in which the word line is of the polycide structure, in order to decrease the resistance of the word line, in which FIG. 1A is a plan view showing the pattern of the memory cell array and FIG. 1B is a cross-sectional view along line A—A of FIG. 1A. As can be seen from the drawings, the EPROM comprises p-type silicon semiconductor substrate 31, field insulation film 32 selectively formed on the surface of the substrate 31, source region 33 consisting of an n-type diffusion region, drain region 34 which also consists of an n-type diffusion region, channel region 35 positioned between source region 33 and drain region 34, gate insulation film 36 formed on channel region 35, floating gate 37 of a memory cell formed of a first polysilicon layer, gate insulation film 38 formed to cover floating gate 37, and word line 39 formed of a second polysilicon layer. Word line 39 also acts as a control gate of the memory cell. The EPROM further comprises molybdenum silicide layer 40 formed directly on word line 39 to decrease the resistance of the word line, bit line 41 formed of a metal, e.g., aluminum, and contact hole 42 serving to connect drain region 34 of each memory cell to each bit line 41.

In the EPROM of this particular construction, the charge-retaining property of floating gate 37 depends on the insulating property of gate insulation films 36 and 38, which are generally formed of silicon oxide. It follows that in the case of using a silicon oxide film through which leak current tends to flow easily, i.e., which is low in barrier height, it is impossible to ensure a sufficiently high charge-retaining property, leading to a low reliability in terms of the ability of the EPROM to retain stored data.

In the conventional method of forming a titanium silicide layer on the surface of a polysilicon layer, the step of forming a silicon oxide layer covering the gate insulation film is completed before the titanium silicide layer is formed thereon, thus making it possible to obtain a floating gate covered with a high quality silicon oxide film. However, titanium is highly reactive with silicon oxide, and thus, the titanium contained in the titanium silicide layer reacts vigorously with the silicon oxide film formed in advance. In addition, the titanium atoms are downwardly diffused toward the inner region of the substrate, along the grain boundry of the polysilicon, so as to markedly deteriorate the insulating property of the silicon oxide film.

FIG. 1B shows that the substantial word line is of two-layer structure, consisting of second polysilicon layer 39 and molybdenum silicide layer 40. The general method of obtaining this particular construction comprises the first step of depositing gate insulation film 38 on floating gate 37, followed by depositing, in succession, second polysilicon layer 39 and molybdenum silicide layer 40. Then, uppermost silicide layer 40 is precisely patterned by photolithography, followed by etching, in succession, molybdenum silicide layer 40, second polysilicon layer 39, gate insulating film 38, and floating gate 37, by means of a self-aligned etching technique. After the etching, source region 33 and drain region 34 are formed by diffusion, followed by oxidizing the surface regions of molybdenum silicide layer 40, second polysilicon layer 39, and floating gate 37, so as to form a silicon oxide film. It follows that the silicon oxide film positioned on the surface of floating gate 37 is caused to contain traces of molybdeum, leading to deterioration in its electrical insulating properties. In other words, electric current tends to leak through floating gate 37. It should also be noted that molybdenum silicide layer 40 crosses many sharply-stepped portions X at the edges of floating gates 37, as is shown in FIG. 1B. As a result, deep notches are formed in molybdenum silicide layer 40, resulting in it having a high electrical resistance.

In order to improve the access speed of an EPROM, it is necessary to suppress the electrical resistance of the word line as much as possible. A polycide structure has been proposed for lowering the resistance of the word line, which uses tungsten, titanium, molybdenum, etc. Such a structure, however, gives rise to sharply stepped portions X, as is shown in FIG. 1B, when it is applied to an EPROM, resulting in a failure to lower the resistance of the word line, as desired. In short, the prior art as shown in FIGS. 1A and 1B is incapable of improving the access speed of an EPROM. (First disadvantage of the prior art).

Providing a two-aluminum-layer structure in which a second aluminum layer is formed on the contact region between a first aluminum layer and a diffusion layer is an effective method of lowering the resistance of the word line. In this case, however, the second aluminum layer tends to break above the contact region. Thus, in order to lower the resistance of word line 39, without using silicide layer 40 in the conventional cell structure shown in FIG. 1A, it is necessary to provide second aluminum layer 400, as is denoted by a broken line in FIG. 1A, in place of silicide layer 40 shown in FIG. 1B. Of course, a signal, being same as the signal conducted through word line 39, is conducted through second aluminum layer 400. In this case, however, sharply stepped portions X are formed in second aluminum layer 400. To suppress the increase in resistance caused by the stepped portions, it is necessary to make second aluminum layer 400 wider than first aluminum layer 41. Naturally, second aluminum layer 400 is rendered wider than polysilicon layer 39 of the cell, as can be seen from FIG. 1A. It follows that the transmitting of an ultraviolet light to reach floating gate (first polysilicon layer) 37 is obstructed, resulting in a longer time required for data erasure. (Second disadvantage of the prior art)

SUMMARY OF THE INVENTION

An object of the present invention is to provide a nonvolatile semiconductor memory in which the resistance of the word line is lowered so as to improve the access speed.

Another object is to provide a high-speed nonvolatile semiconductor memory which prevents the data erasure time from being prolonged.

To achieve the object, a second word line (22) is formed above a source region (13) positioned between a pair of first word lines (19A, 19B), such that the second word line is electrically connected to each of the first word lines, so as to lower the resistance of the word lines. Since only one line is formed above the source region, as the second word line, it is possible to prevent the cell area from being unnecessarily increased. Also, formation of the second word line permits a lowering of the resistance of the word lines, making it unnecessary to increase the width of the first word lines. It follows that it is possible to design an IC pattern which will facilitate the transmitting of an ultraviolet light for data erasure to reach the floating gate (17) below the first word line (19B).

BRIEF DESCRIPTION OF THE DRAWINGS

FIG. 2A is a plan view showing a part of the cell structure for an EPROM according to one embodiment of the present invention;

FIG. 2B is a cross sectional view along line B—B* shown in FIG. 2A;

DESCRIPTION OF THE PREFERRED EMBODIMENTS

Figure 1A:
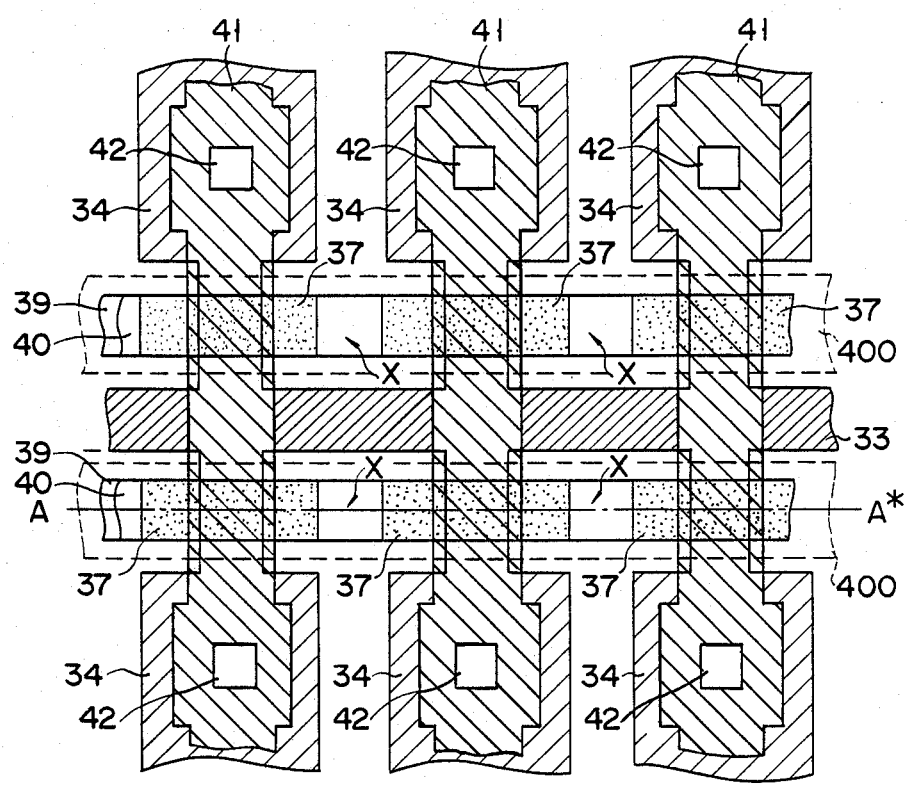
FIG. 1A is a plan view showing a part of the cell structure for the conventional EPROM.
Figure 1B:
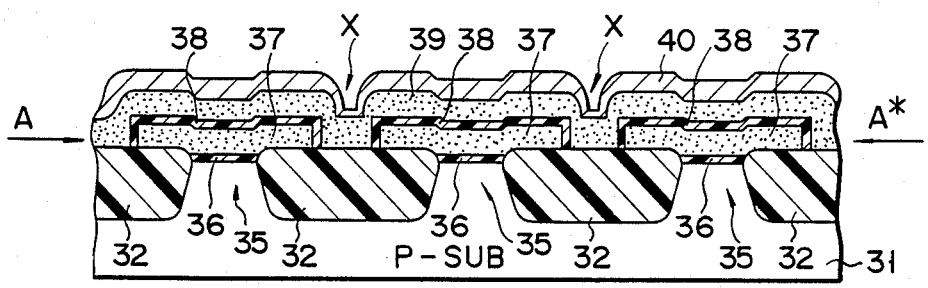
FIG. 1B is a cross sectional view along line A—A* shown in FIG. 1A.

FIGS. 2A and 2B collectively show a nonvolatile semiconductor memory according to one embodiment of the present invention, in which FIG. 2A is a plan view showing the pattern of the memory cell array portion of the memory and FIG. 2B is a cross sectional view along line B—B* shown in FIG. 2A. As seen from FIG. 2B, field insulating film 12 is selectively formed on a p-type silicon semiconductor substrate. Source region 13 common with a plurality of memory cells is formed by diffusing an n-type impurity, such that source region 13 extends laterally, as seen from FIG. 2A. Drain region 14 for each of the memory cells is also formed by diffusing an n-type impurity. As seen from FIG. 2A, drain regions 14 are provided in a staggered arrangement on either side of source region 13. Further, channel region 15 for each memory cell is provided between source region 13 and drain region 14. Incidentally, bit line 24 shown in FIG. 2A is omitted in FIG. 2B. Gate insulating film 16 formed of, for example, silicon oxide, is provided on each channel region 15. Floating gate 17 for each memory cell is formed by depositing a first polysilicon layer on gate insulating film 16. Gate insulating film 18 consisting of, for example, silicon oxide, is further formed in a manner to cover floating gate 17. First word line 19A is formed of a second polysilicon layer. First word line 19A also acts as a common control gate for a plurality of memory cells provided with drain regions 14 arranged on the upper side of source region 13 in the plan view shown in FIG. 2A. Likewise, another first word line 19B, which also consists of the second polysilicon layer, acts as a common control gate for a plurality of memory cells provided with drain regions 14 arranged on the lower side of source region 13 in the plan view shown in FIG. 2A.

The same signal is supplied to the pair of first word lines 19A, 19B. As seen from FIG. 2B, second word line 22 is provided above source region 13 positioned between first word lines 19A and 19B. Second word line 22 consists of lower polysilicon layer 20 and upper metal silicide layer 21 having a high melting point. The silicide of, for example, molybdenum, titanium, tungsten or tantalum is used for forming upper layer 21 of second word line 22.

Second word line 22 is provided to partly overlap with paired first word lines 19A, 19B for every plural memory cells. In the overlapping portion, second word line 22 is connected to each of first word lines 19A, 19B via contact hole 23. In the embodiment shown in FIGS. 2A and 2B, contact hole 23 is provided for every plural cells, not for each of the cells. The particular construction permits suppressing an increase in the IC chip area caused by the provision of contact hole 23.

For forming second word line 22, polysilicon layer 20 is formed first, followed by doping the upper region of polysilicon layer 20 with an impurity of phosphorus or arsenic, and subsequently forming a metal silicide layer to cover the doped upper region so as to form upper silicide layer 21. The metal silicide layer is formed by sputtering, for example, $MoSi_2$, $TiSi_2$, $WSi_2$ or $TaSi_2$.

The construction shown in FIGS. 2A and 2B can be obtained by precisely patterning the second word line of the double layer structure consisting of silicide layer 21 and polysilicon layer 20 by, for example, a lithography technique. The process for preparing the particular construction is described in, for example, the publications given below:

1. S. P. Murarka et al., "Refractory Silicides of Titanium and Tantalum for Low-Resistivity Gates and Interconnects", IEEE Transactions on Electron Devices, ED-27, No. 8, pp 1409-1417, 1980.
2. F. Mohammadi, "Silicides for Interconnection Technology", Solid State Technology, pp 65-72, 1981.
3. U.S. Pat. No. 4,528,744, "Method of Manufacturing a Semiconductor Device", T. Shibata.
4. U.S. Pat. No. 4,378,628, "Cobalt Silicide Metallization for Semiconductor Integrated Circuits", H. J. Levinstein et al.

All disclosures of the above four publications are incorporated in the present specification.

As seen from FIG. 2A, a plurality of long bit lines 24 each consisting of a metal such as aluminum are formed to cross first word lines 19A, 19B. Each bit line 24 is connected to drain region 14 via contact hole 25.

As described above, second word line 22, which contains a metal and, thus, is low in electric resistance, is connected to first word lines 19A, 19B, making it possible to lower the resistance of the word lines.

Incidentally, second word line 22 may be formed of either a polysilicon layer or a metal silicide layer.

In the embodiment described above, the memory cells are provided in a staggered arrangement on either side of source region 13. Also, the same signal is applied to first word lines 19A, 19B disposed with source region 13 interposed therebetween. It follows that it is possible to optionally select a single memory cell by combination of these word lines and bit lines 24. This makes it possible to commonly use single second word line 22 for two first word lines 19A, 19B.

Further, that portion of second word line 22, which is disposed above source region 13, is interposed between two first word lines 19A, 19B. In short, the space above source region 13, which is not utilized in the prior art, is effectively utilized in the present invention. The space in question is relatively large, making it possible to sufficiently increase the width of second word line 22. Naturally, the electric resistance of the word lines can be effectively lowered.

What should be noted is that second word line 22 is connected via contact holes 23 to first word lines 19A, 19B for every plural cells. Because of the particular construction, it is possible to form second word line 22 on a smooth surface. Specifically, the first polysilicon layer used for forming first word lines 19A, 19B is formed first by deposition, followed by forming silicon dioxide layer 100 having a smooth surface on the substrate surface, such that the surfaces of the first word lines are covered with the silicon dioxide layer noted above. What should also be noted is that second word line 22 is formed on the smooth surface of silicon dioxide layer 100. In the prior art, however, the second word line is formed on a surface having stepped portions, leading to deep notch of the second word line. As a result, the resistance of the word line is abnormally increased so as to lower the access speed of the memory. Naturally, the memory of the present invention permits overcoming the difficulty noted above.

An additional merit to be noted is that contact hole 23 for connecting second word line 22 to first word line 19A or 19B is provided apart from floating gate 17 in the present invention. The particular construction makes it unnecessary to employ the step of removing gate insulating film 18 so as to expose the surface of floating gate 17. It is also unnecessary to employ the step of covering floating gate 17 with silicon oxide film 18, with silicide layer 21 left exposed, i.e., the step employed in the conventional manufacturing process of EPROM of the polycide structure. It follows that, in the present invention, it is impossible for an impurity, such as a metal, to enter gate insulating film 18 covering floating gate 17. Naturally, floating gate 17 is enabled to retain the electric charge sufficiently, leading to a high reliability.

As described above, the resistance of the word line can be sufficiently lowered in the nonvolatile semiconductor memory structure shown in FIGS. 2A and 2B, leading to an improved access speed. In addition, the memory is highly reliable.

Figure 3A:
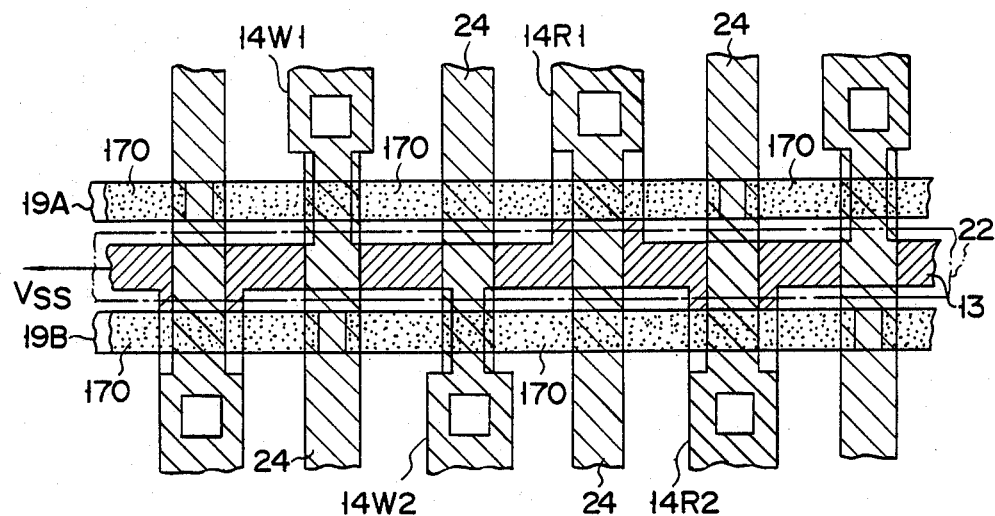
FIG. 3A is a plan view showing a part of the four transistor-cell structure for an EPROM according to another embodiment of the present invention.
Figure 3B:
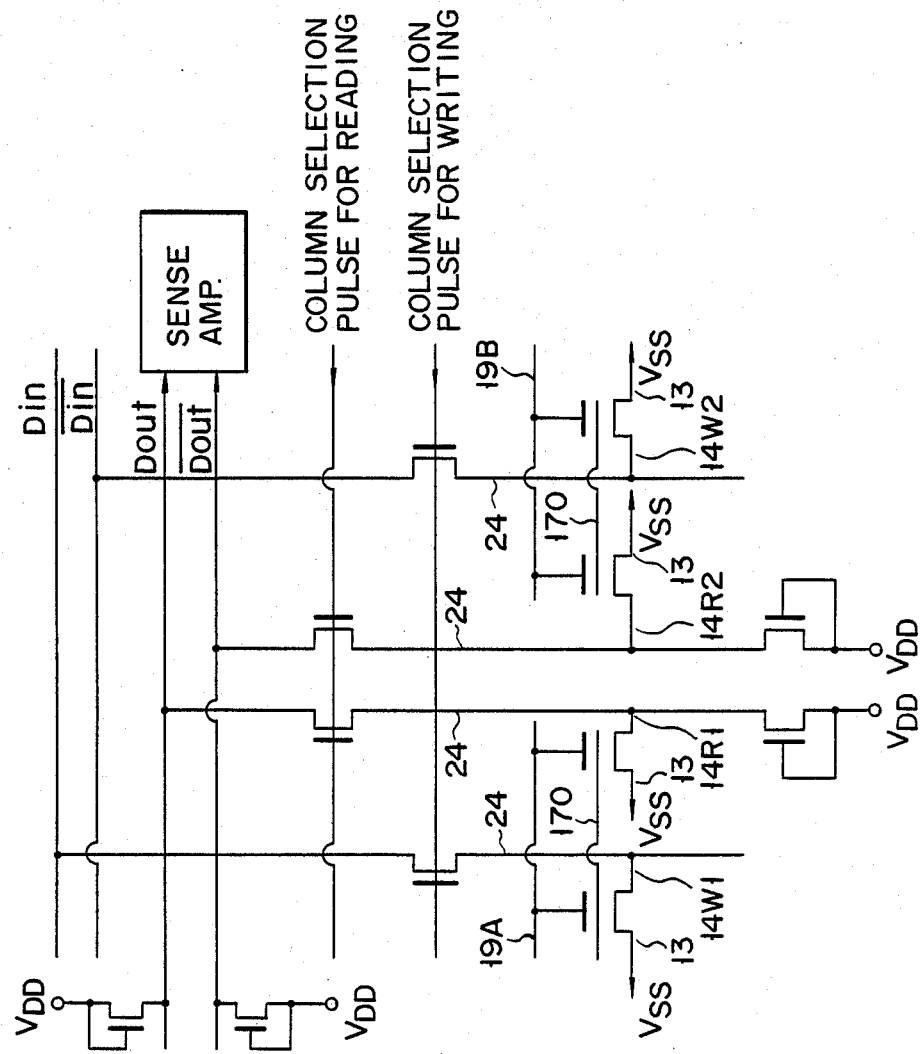
FIG. 3B shows a circuit diagram including the four transistor-cell shown in FIG. 3A and peripheral circuit elements.

FIG. 3A shows that the technical idea of the present invention is applied to an EPROM of four-transistor cells. The circuit of the cell shown in FIG. 3A is constructed as shown in FIG. 3B. This embodiment is equal to the embodiment shown in FIG. 2A, except that two floating gates are provided in the embodiment of FIG. 3A. In the embodiment of FIG. 3A, floating gate 170 is commonly used for a writing MOS transistor including drain 14W1, and a reading MOS transistor, including drain 14R1. Likewise, another floating gate 170 is commonly used for a writing MOS transistor, including drain 14W2, and a reading MOS transistor, including drain 14R2. It should be noted that the data read out speed can be increased by lightly-doped drains 14R1 and 14R2, i.e., LDD structure, and by pulling up the bit lines of these drains 14R1 and 14R2 toward power source potential $V_{DD}$. An EPROM of the LDD structure is described in detail in Japanese Patent Application No. 60-277833 filed on Dec. 12, 1985. This Japanese Application is directed to an invention developed by the inventors of the present application. U.S. patent application Ser. No. 07/042,877 corresponding to the said Japanese Application, filed at the U.S. Patent Office on Apr. 24, 1987, has matured to U.S. Pat. No. 4,788,663 All disclosure of this U.S. application are incorporated in the present specification.

Figure 4:
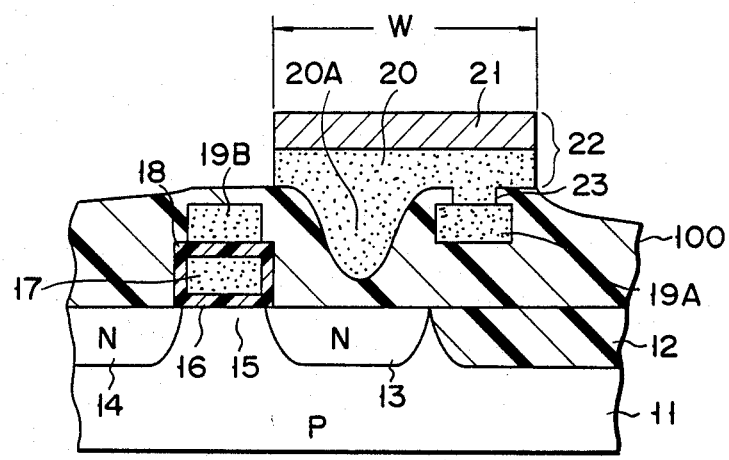
FIG. 4 is a cross sectional view showing a modification of the embodiment shown in FIG. 2B.

FIG. 4 shows a modification of FIG. 2B, though the bit line 24 shown in FIG. 2B is omitted in FIG. 4. It is seen that polysilicon layer 20 extends downward in part 20A into field oxide film 100 in FIG. 4. As a result, the cross sectional area of polysilicon layer 20 below second word line 22 can be increased without increasing the width of second word line 22. Naturally, the increased cross sectional area of polysilicon layer 20 results in a lower electric resistance of the word line.

Figure 5A:
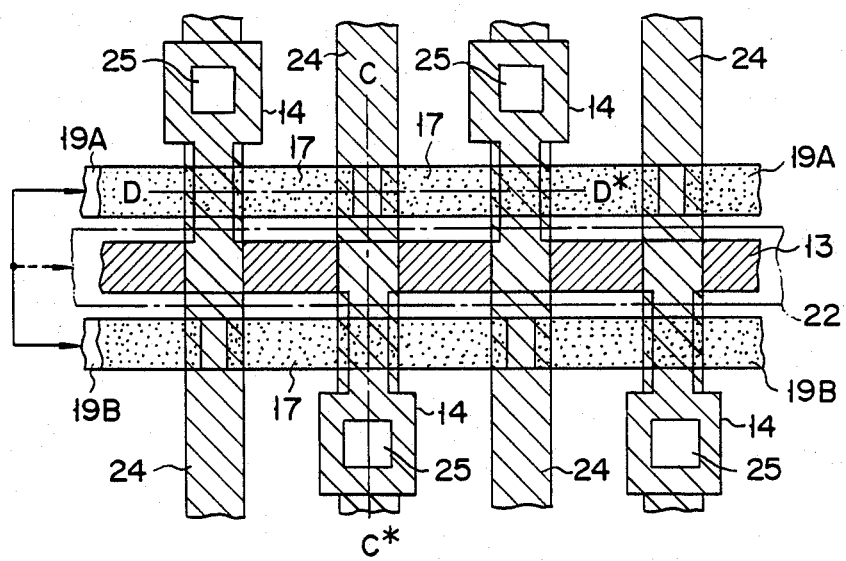
FIG. 5A is a plan view showing a part of the cell structure for an EPROM according to still another embodiment of the present invention.
Figure 5B:
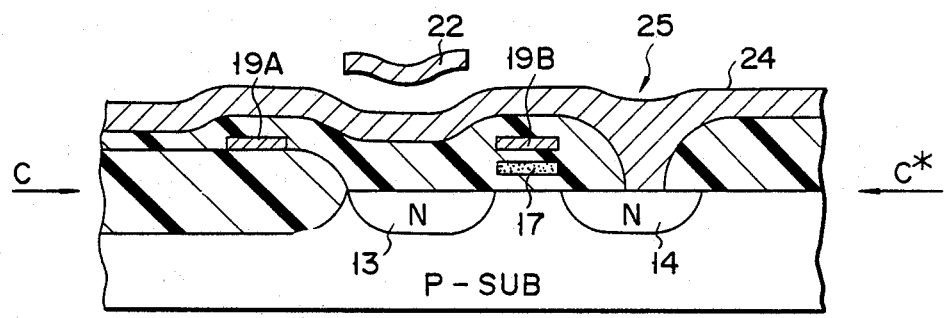
FIG. 5B is a cross sectional view along line C—C* shown in FIG. 5A.
Figure 5C:
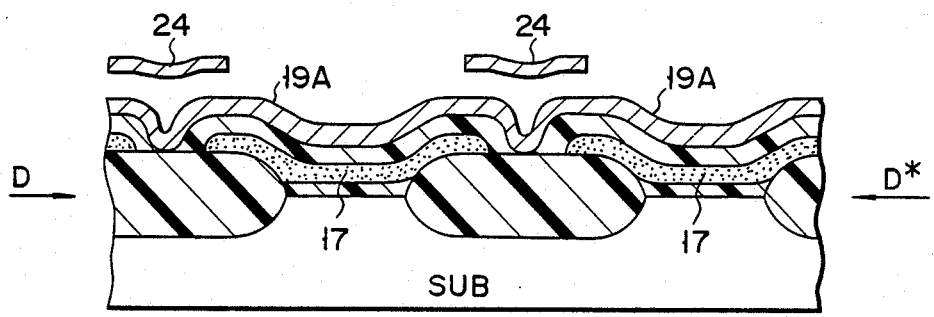
FIG. 5C is a cross sectional view along line D—D* shown in FIG. 5A.

FIGS. 5A to 5C collectively show another embodiment of the present invention, in which FIG. 5A is a plan view, FIG. 5B is a cross sectional view along line C—C* of FIG. 5A, and FIG. 5C is a cross sectional view along line D—D* of FIG. 5A. It is seen that the apparatus comprises common source region (n+ diffusion layer) 13, drain region (n+ diffusion layer) 14, word lines (second polysilicon layer) 19A, 19B, floating gate (first polysilicon layer) 17, bit line (first aluminum wiring) 24, contact hole 25, and second aluminum wiring 22. It is important to note that the signal supplied to source wiring 13, formed by an impurity diffusion, is also supplied to word lines 19A, 19B, formed in parallel with source wiring 13, such that source wiring 13 is interposed between word lines 19A, 19B. Also, first aluminum wiring 24 constituting a bit line extends to cross the word lines (19A, 19B) in a direction perpendicular to the extending direction of these word lines.

The particular construction provides a programmable memory cell array in which an ultraviolet light is used for the data erasure.

Figure 6A:
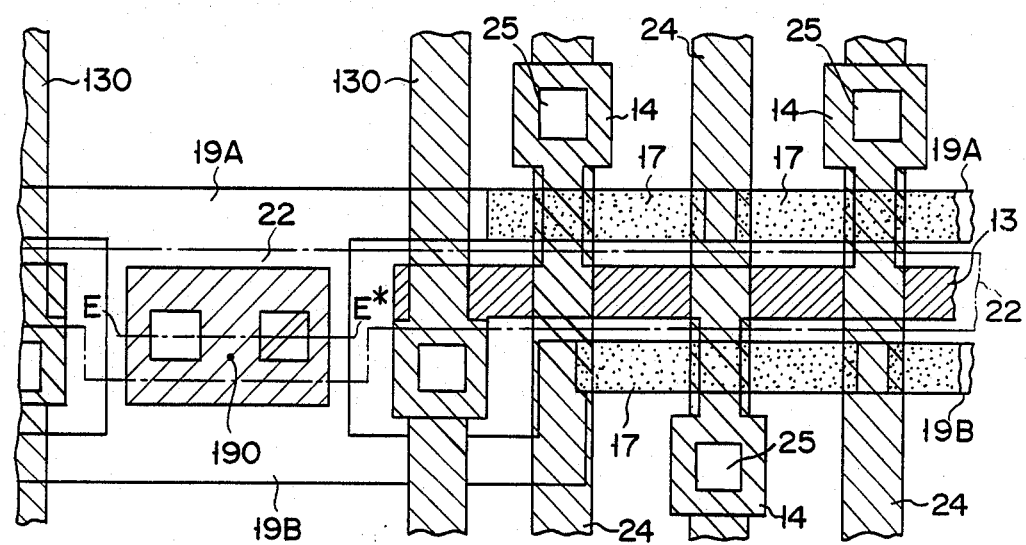
FIG. 6A is a plan view showing the via contact portion between the paired word lines (19A, 19B) and the aluminum wiring (22) included in the EPROM shown in FIG. 5A.
Figure 6B:
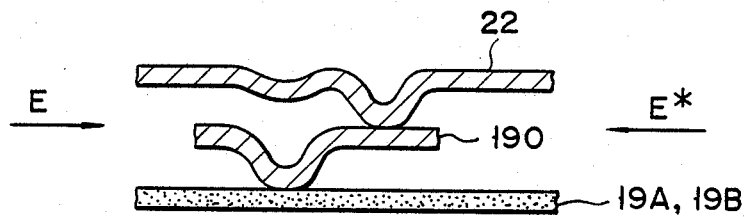
FIG. 6B is a cross sectional view of the via contact portion along line E—E* shown in FIG. 6A.

FIG. 6A shows a via contact portion at which word lines 19A, 19B are connected to aluminum wiring 22. FIG. 6B is a cross sectional view along line E—E* of FIG. 6A. As seen from FIG. 6B, via contact 190 is formed between aluminum wiring 22 and word lines 19A, 19B. The presence of via contact 190 permits moderating the deep notch of aluminum wiring 22, compared with the case where aluminum wiring 22 is directly brought into contact with word lines 19A, 19B.

To reiterate, second aluminum wiring 22 acting as a word line is formed above source wiring 13 in parallel with word lines 19A, 19B. As seen from FIGS. 6A and 6B, aluminum wiring 22 is brought into contact with word lines 19A, 19B at via contact portions 190 for every several cells. Here, it should be noted that, unsimilar to the prior art, two word lines 19A, 19B sandwich the source wiring (13) therebetween in a parallel manner. Thus, it suffices to use single second aluminum wiring 22, serving to lower the resistance of the word line, with respect to two word lines 19A, 19B. In addition, wiring 22 is not obstructive to the direct irradiation of floating gate 17 with an ultraviolet light, as apparent from FIGS. 5A, 5B. In other words, the data erasure time is not elongated by the presence of aluminum wiring 22.

As described above, the embodiment of FIGS. 5A to 5C permits lowering the electric resistance of the word line so as to provide an EPROM of a high operating speed. In addition, the data erasure can be achieved in a short time because the metal wiring (second aluminum wiring) is not positioned above the floating gate.

The present invention is not restricted to the embodiments described above, though the accompanying drawings are presently thought to constitute the most practical and preferred embodiments. For example, word line 22 of a double layer structure shown in FIGS. 2A and 2B may be replaced by single polysilicon layer 20 equal in thickness to word line 22. Suppose polysilicon layer 20 shown in FIG. 2B has an electric resistivity of about 40 $\Omega/cm^2$. In this case, the polysilicon layer of a thickness equal to that of the word line 22 has a resistivity of about 25 to 30 $\Omega/cm^2$. In other words, word line 22 consisting solely of a single polysilicon layer exhibits an acceptably low resistivity. It should be noted, however, that word line 22 of a double layer structure shown in FIG. 2B permits lowering the resistivity to about 2 to 10 $\Omega/cm^2$ and, thus, is more desirable than the word line formed of a single polysilicon layer, quite naturally. Suppose word line 22 of the double layer structure is replaced by a single layer of a metal, e.g., aluminum. In this case, the resultant structure is rendered substantially equal to the structure shown in FIGS. 5A to 5C which involves the structure of double aluminum wiring layers 22 and 24. By the contrary, aluminum wiring 22 shown in FIG. 5B may be replaced by a double layer structure formed of a metal silicide layer having a high melting point and a polysilicon layer, or by a single layer of polysilicon. In this case, the resultant structure is substantially equal to the structure shown in FIG. 5B or FIG. 2B.

What is claimed is:

1. A nonvolatile semiconductor memory, said memory including a plurality of memory cell transistors each having a source, a drain, and a floating gate which is located over a channel region formed between said source and said drain, wherein said memory also comprises:

a source diffusion region extending in one direction, said source diffusion region being common to said sources of said memory cell transistors and serving as wiring of said sources;

a pair of first word lines arranged in parallel with said source diffusion region, said source diffusion region being located under an area between said pair of first word lines and said pair of first word lines being located over said respective floating gates of said memory cell transistors;

bit lines electrically connected to said respective drains of said memory cell transistors, said bit lines being arranged to cross said pair of first word lines; and a second word line located over the area between said pair of first word lines and electrically connected in parallel to said pair of first word lines.

2. The memory according to claim 1, which further comprises a plurality of pairs of said first word lines, wherein a second word line is provided for each of said pairs of first word lines.

3. The memory according to claim 1, wherein said plurality of memory cells are arranged along said second word line, and parts of said first word lines acting as control gates are brought into contact, via contact holes, with said second word line at intervals of several memory cells.

4. The memory according to claim 3, wherein said contact holes are formed at locations directly above said first word lines, said locations being away from the said floating gate electrodes of said memory cell transistors.

5. The memory according to claim 1, wherein said second word line has a double layer structure comprising a polysilicon layer and another layer being formed of a silicide of a metal having a high melting point.

6. The memory according to claim 5, which further comprises a first insulating layer interposed between said floating gate electrodes and said channel regions of said memory cell transistors, a second insulating layer interposed between said pair of first word lines and said floating gate electrodes of said memory cell transistors, and a field insulation layer interposed between said second word line and said first word lines.

7. The memory according to claim 6, wherein a part of said polysilicon layer extends downward into said field insulating layer.

8. The memory according to claim 1, wherein said second word line comprises a polysilicon layer.

9. The memory according to claim 8, which further comprises a first insulating layer interposed between said floating gate electrodes and said channel regions of said memory cell transistors, a second insulating layer interposed between said pair of first word lines and said floating gate electrodes of said memory cell transistors, a field insulation layer interposed between said second word line and said first word lines, wherein a part of said polysilicon layer extends downward into said field insulating layer.

10. The memory according to claim 1, wherein said second word line comprises a metal silicide layer.

11. A nonvolatile semiconductor memory which utilizes ultraviolet light for data erasure, said memory including a large number of memory cell transistors each having a source, a drain, and a floating gate which is located over a channel region formed between said source and said drain, wherein said memory also comprises:

a source wiring diffusion layer, said source wiring diffusion layer being common to said sources of said memory cell transistors and serving as wiring of said sources;

a pair of word lines extending in said first direction in parallel with said source wiring diffusion layer, said source wiring diffusion layer being located under an area between said pair of word lines and said pair of word lines being located over said respective floating gates of said memory cell transistors;

bit lines electrically connected to said respective drains of said memory cell transistors, said bit lines extending to cross said pair of word lines; and a signal wiring located over the area between said pair of word lines and electrically connected in parallel to said pair of word lines.

12. The memory according to claim 11, which further comprises a via contact portion at which said signal wiring is brought into contact with said pair of word lines.

13. The memory according to claim 12, wherein said via contact portions are provided at a prescribed interval in said first direction of said pair of word lines.

14. The memory according to claim 11, wherein said signal wiring contains a metal.

15. The memory according to claim 11, wherein said signal wiring contains a polysilicon.

16. The memory according to claim 11, wherein said signal wiring contains a silicide of molybdenum, titanium, tungsten, or tantalum.

* * * * *